INVENTOR.
WILLIAM F. EGAN
BY John F. Lawler
ATTORNEY

United States Patent Office 3,355,677
Patented Nov. 28, 1967

3,355,677

PHASE COHERENT OSCILLATOR

William F. Egan, Cupertino, Calif., assignor to Sylvania Electric Products Inc., a corporation of Delaware Filed Mar. 15, 1965, Ser. No. 439,747
1 Claim. (Cl. 331—173)

ABSTRACT OF THE DISCLOSURE

An input signal and a resistive load are electrically connected through a diode to the tuned circuit of an oscillator. The diode is normally approximately zero biased so that the load is in parallel with and lowers the Q of the tuned circuit. The input signal is also coupled to a signal processor which produces a control pulse that is applied to the diode. When an input signal is received, it is passed by the diode and drives the tuned circuit and the oscillator. After processing of the input signal, the control pulse reverse biases the diode to disconnect the load from the tuned circuit so that energy stored in the tuned circuit causes the oscillator to sustain oscillations in phase with the input signal.

This invention relates to coherent oscillators for generating an output having a fixed phase relationship with an input signal.

Coherent radar and certain other systems require a fixed phase relationship between radio frequency (RF) pulses and a continuous wave (CW) signal generated by the system. One prior art method of establishing this phase relationship is energizing a coherent oscillator a predetermined time interval before the pulse is received such that in-phase oscillation is assured by the time the input pulse is received. Obviously this technique is practicable only if advance information on the pulse transmisison is available, and therefore has no utility for applications wherein the time of arrival of received signals is unknown. One proposed technique for providing the required phase synchronization in the latter application is adjustment of the bias of the coherent oscillator so that it oscillates but that it will cease oscillating upon a slight reduction in gain. The oscillator is thus forced to oscillate in phase with the input pulse when the latter is received. The gain adjustment of such an oscillator is critical. Such an oscillator may become phase synchronized with spurious input signals such as noise.

An object of this invention is the provision of a coherent oscillator that is restrained from oscillating until an input signal is received.

Another object is the provision of an oscillator which, upon receipt of an input signal, rapidly produces an output that is phase coherent with the input signal.

Another object is the provision of means for causing a de-energized oscillator to oscillate in phase coherence with an input signal when advance knowledge of the time of arrival of the input signal is not available.

Another object is the provision of an oscillator that is restrained from supporting sustained oscillations in response to spurious input signals.

Another object is the provision of an oscillator that is unaffected by changes in the input signal after the oscillator generates sustained oscillations.

Another object is the provision of an amplifier circuit which, upon receipt of an input signal, may be selectively switched to operate as a free running oscillator for generating an output in phase coherence with the input signal.

In accordance with this invention, a resistive load is selectively connected to a tuned circuit of an oscillator to lower the Q of the tuned circuit and prevent oscillations and is disconnected from the tuned circuit to increase it Q so that oscillations are sustained. In a preferred embodi ment of the invention, the active element (transistor) o the oscillator conducts at all times. An input signal and a low resistance load are connected to the tuned circuit o the oscillator through a diode that is approximately zer biased. A control signal is also applied to the diode. Whe an input signal in excess of a minimum amplitude is ap plied to the oscillator, the tuned circuit is driven throug the diode. More particularly, the tuned circuit is drive by the input signal (energy is transferred to the tune circuit) whenever the magnitude of the input signal exceeds the magnitude of the signal stored in the tank circuit so as to forward bias the diode. When the magnitudes of the input signal and the control signal are such that the diode is reverse biased, the low resistance load is disconnected from the tank circuit allowing the signal stored in the tank circuit to decay so that the oscillator sustains oscillation. When the magnitudes of the control signal and the input signal are such that the diode is forward biased but the tuned circuit is not driven by the input signal, the signal stored by the tank circuit is rapidly dissipated by the low resistance load connected to the tuned circuit through the diode.

This invention and these and other objects thereof will be better understood from the following description of a preferred embodiment thereof, reference being had to the accompanying drawings in which.

Figures 1, 2:
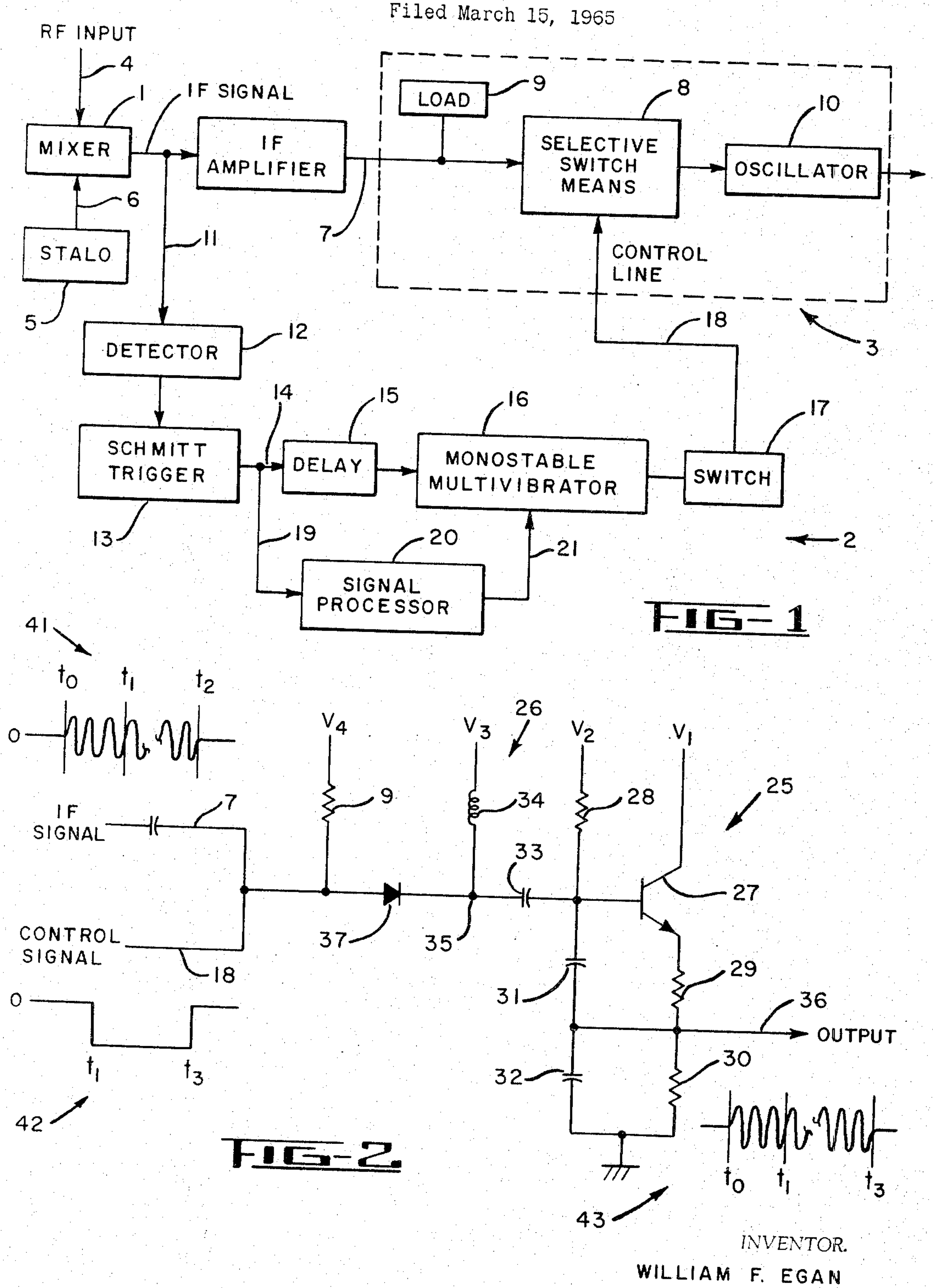
FIGURE 1 is a block diagram of a receiver embodying this invention.
FIGURE 2 is a circuit diagram of a preferred embodiment of the phase coherent oscillator of FIGURE 1.

Specific reference being had to FIGURE 1, the receiver comprises a mixer 1, control circuit 2 and a coherent oscillator 3. An RF signal on line 4 and the output of stable local oscillator 5 on line 6 are mixed in mixer 1 to generate an intermediate frequency (IF) signal. The IF signal is amplified and applied on line 7 to selective switch means 8 of coherent oscillator 3. A load 9 is connected through selective switch means 8 to an oscillator 10.

The IF signal on line 11 is rectified by detector 12 and is shaped by Schmitt trigger 13. The output of the Schmitt trigger on line 14 is delayed by delay 15 and applied to monostable multivibrator 16. The output of multivibrator 16 actuates a switch 17. The output of switch 17 is either a negative bias potential or an open circuit. The output of switch 17 on line 18 controls the operation of selective switch means 8. The output of the Schmitt trigger on line 19 is processed by signal processor 20 which determines whether the input signal is a desired electromagnetic signal or a spurious input signal such as noise. This determination may be made, for example, by analyzing the pulse repetition frequency or pulse width of the output of the Schmitt trigger. The output of the signal processor on line 21 controls the operation of multivibrator 16.

The preferred embodiment of coherent oscillator 3 illustrated in FIGURE 2 contains oscillator 10 comprising an amplifier 25 having a tuned circuit 26 in the base-input circuit of a transistor 27. The transistor is biased to operate in the active region by resistors 28, 29 and 30.

Tuned circuit 26 comprises capacitors 31, 32 and 33 and inductor 34. Capacitors 31 and 32 are connected in series between the base-input terminal of the transistor and a reference potential. One terminal of capacitor 33 is also connected to the base-input terminal of the transistor. One terminal of inductor 34 is connected to a positive supply potential. The other terminals of capacitor 33 and inductor 34 are connected at 35. The tuned circuit is preferably resonant at the center of the input frequency and. The output of the oscillator on line 36 is fed back to the base of the transistor through capacitors 31 and 32.

Selective switch means 8 comprises a diode 37 having a cathode connected to junction 35 and an anode connected to input line 7 and through load 9 to a positive supply potential. Load 9 is preferably a resistor having a low resistance. Load 9 may be the output impedance of the IF amplifier. The anode of diode 37 is also connected to control line 18.

During quiescent conditions prior to time $t_0$, transistor 27 operates in the active region and the output of switch 17 is an open circuit. Diode 37 is approximately zero biased by potential $V_4$ and the open circuit on line 18. At time $f_0$, diode 37 is forward biased by the positive going IF signal on line 7 (waveform 41) and conducts. Conduction of diode 37 connects load 9 in shunt with inductor 34 of tuned circuit 26. The IF signal therefore simultaneously drives the tuned circuit (energy is transferred to the tuned circuit and stored by the reactive elements thereof) through a low impedance source and is amplified by amplifier 25. The amplitude of the IF signal is adjusted to be equal to the steady state value of the signal stored in the tuned circuit.

The tuned circuit has a low Q when diode 37 conducts since it is shunted by a low resistance load 9. The signal stored in the tuned circuit therefore builds up rapidly to a steady state value. The magnitude of the IF signal and the signal stored in the tuned circuit are approximately equal after a few cycles of the IF signal, e.g., at time $t_1$. Whenever the IF signal is present on line 7 and the potential at junction 35 is more negative than the potential on the anode of diode 37, the diode conducts and the IF signal prevents the junction 35 potential decreasing more rapidly than the IF signal. Whenever the junction 35 potential is more positive than the IF signal on line 7, diode 37 is cut off and the tank circuit supports self-sustained oscillation. After the signal stored by the tuned circuit builds up to its steady state value, the output of the tank circuit and the output (waveform 43) of the oscillator are thus phase synchronized when the diode is cut off.

The IF signal on line 11 is detected and actuates Schmitt trigger 13 when the detected signal exceeds a prescribed threshold level. The output of the Schmitt trigger on line 14 is delayed to allow the signal stored in the tuned circuit to build up to its steady state value. The delayed signal triggers multivibrator 16 to switch conduction states and switch 17 to generate a negative bias potential on line 18. The negative signal on line 18 (see waveform 42, FIGURE 2, time $t_1$) reverse biases and cuts off diode 37. Diode 37 is cut off until the multivibrator again switches conduction states and operates in its original conduction state. Cutoff of diode 37 disconnects load 9 from the tuned circuit to allow the tuned circuit to support self-sustained oscillation and drive the transistor at the natural resonant frequency of the tuned circuit. The negative potential on control line 18 prevents changes in the signal on line 7 affecting the output of the oscillator. Thus, there is a fixed phase relationship between the oscillator output 43 and the phase of the IF signal 41 at time $t_1$. The oscillator does not reproduce phase changes in the IF signal occurring after time $t_1$. The outputs of multivibrator 16 and switch 17 on line 18 maintain diode 37 cut off until the multivibrator completes one cycle of operation in its natural frequency of operation (waveform 42, time $t_3$, FIGURE 2) or until the multivibrator is caused to change operating states in response to a control signal on line 21.

The output of the Schmitt trigger is also processed by signal processor 20. If it is determined that the IF signal is a desired electromagnetic signal, the output of the signal processor on line 21 does not affect the operation of multivibrator 16. The multivibrator continues to conduct to complete one cycle of operation at its natural frequency of operation (until time $t_3$, waveform 42, FIGURE 2). If it is determined that the IF signal on line 11 is a spurious input such as noise, however, the output of signal processor 21 causes multivibrator 16 and switch 17 to change operating states to apply an open circuit on line 18 to the anode of diode 37. When the signal stored in the tuned circuit decays and the junction 35 potential is more negative than the potential on the anode of diode 37, the diode conducts and connects load 9 to the tuned circuit. Load 9 is a low resistance that loads the tuned circuit and reduces the circuit Q. The signal stored in the tuned circuit is therefore rapidly dissipated in load 9 and the tuned circuit no longer supports self-sustained oscillation of significant magnitude.

In practice, small oscillations may occur on output line 36 with zero volts bias (average) across diode 37, since the diode is still a relatively high impedance with a slight negative voltage at junction 35. The signal at junction 35 is therefore amplified until the diode conducts sufficiently to dissipate the signal stored in the tuned circuit through load 9. Current flow through diode 37 prior to time $t_0$ is kept small to reduce the average current flow through the diode, since a discontinuation of this average current will cause an undesired transient at time $t_1$.

By way of example, a coherent oscillator embodying this invention was operated at 60 mc. over an input frequency range from 50 mc. to 70 mc. The oscillator was brought into stable operation in phase coherence with an IF signal within less than 0.2 microsecond. Typical components and element values employed in this circuit are:

| | | |
|---|---|---|
| Transistor **27** | | 2N2219 |
| Diode **37** | | 1N5001 |
| Resistor **28** | ohms | 8.2K |
| Resistor **29** | do | 18 |
| Resistor **30** | do | 150 |
| Impedance **9** (resistor) | do | 540 |
| Capacitor **31** | picofarads | 47 |
| Capacitor **32** | do | 47 |
| Capacitor **33** | do | 7 |
| Inductor **34** | microhenries | 0.5 |

Although this invention is described in relation to a preferred embodiment thereof, various modifications will be suggested to one skilled in the art. For example, the tuned circuit may be a series or shunt tuned circuit or other type of resonant device. Similarly, the tuned circuit may be connected in other than the control circuit (the base circuit of transistor 27) as long as the storage elements of the tuned circuit are driven by the input signal. Also, load 9 may be a complex impedance having a low resistance component. The scope of this invention is not therefore to be limited by the above detailed description of an embodiment thereof, but is to be determined from the following claim.

What is claimed is:

A coherent oscillator comprising
a power source,
a resonant circuit comprising
 an inductor having a first terminal connected to said power source and having a second terminal,
 a capacitor having a first terminal connected to the second terminal of said inductor to form a junction and having a second terminal, and
 capacitive coupling means,
an amplifier comprising
 a first load impedance, and
 an active element having a first electrode connected through said first load impedance to a reference potential and having a second electrode connected to the second terminal of said capacitor and having a third electrode connected to said power source, said active element operating in its active region at all times, said amplifier output being coupled from said first load impedance, said capacitive coupling means being connected to said first load impedance and to the second terminal of said active element for feeding a portion of the amplifier output back to the amplifier input, a second load impedance having a first terminal connected to said power source and having a second terminal, a diode having a first terminal connected to the junction of said inductor and capacitor and having a second terminal connected to the second terminal of said second load impedance, means for applying an input signal to the second terminal of said diode, said diode connecting said second load impedance in shunt with said inductor and passing the input signal to said resonant circuit and to the amplifier input when said diode conducts and disconnecting said second load impedance from said resonant circuit and blocking the input signal from said resonant circuit and the amplifier input when said diode is cut off, means responsive to the input signal for generating a control signal, and means for applying the control signal to the second electrode of said diode for selectively reverse biasing and cutting off said diode to disconnect said second load impedance from said resonant circuit and to block the input signal from said amplifier and said resonant circuit.

References Cited

UNITED STATES PATENTS

| | | | |
|---|---|---|---|
| 2,856,530 | 10/1958 | Watson | 331—172 X |
| 3,255,424 | 6/1966 | Du Vall | 331—173 |

ROY LAKE, *Primary Examiner.*

J. B. MULLINS, *Assistant Examiner.*